(12) United States Patent
Suzuki et al.

(10) Patent No.: US 8,692,348 B2
(45) Date of Patent: Apr. 8, 2014

(54) PHOTODETECTOR

(75) Inventors: Jun Suzuki, Hamamatsu (JP);
 Fumikazu Ojima, Hamamatsu (JP);
 Ryusuke Kitaura, Hamamatsu (JP)

(73) Assignee: Hamamatsu Photonics K.K.,
 Hamamatsu-shi, Shizuoka (JP)

( * ) Notice: Subject to any disclaimer, the term of this patent is extended or adjusted under 35 U.S.C. 154(b) by 126 days.

(21) Appl. No.: 12/922,805

(22) PCT Filed: Mar. 16, 2009

(86) PCT No.: PCT/JP2009/055064
 § 371 (c)(1),
 (2), (4) Date: Oct. 18, 2010

(87) PCT Pub. No.: WO2009/116496
 PCT Pub. Date: Sep. 24, 2009

(65) Prior Publication Data
 US 2011/0024855 A1 Feb. 3, 2011

(30) Foreign Application Priority Data

Mar. 17, 2008 (JP) .............................. P2008-068074

(51) Int. Cl.
 *H01L 31/058* (2006.01)
 *G01J 5/00* (2006.01)
(52) U.S. Cl.
 USPC ................ 257/467; 257/E31.131; 250/338.1; 250/338.4
(58) Field of Classification Search
 None
 See application file for complete search history.

(56) References Cited

U.S. PATENT DOCUMENTS

| 6,242,738 | B1 * | 6/2001 | Ju ............................... 250/338.1 |
| 2002/0039838 | A1 | 4/2002 | Iida et al. |
| 2002/0139784 | A1 | 10/2002 | Tsuchiya et al. |
| 2008/0135758 | A1 * | 6/2008 | Yang et al. ................. 250/338.1 |
| 2009/0121137 | A1 * | 5/2009 | Liddiard .................... 250/338.1 |
| 2009/0213895 | A1 * | 8/2009 | Pillans .............................. 374/2 |

FOREIGN PATENT DOCUMENTS

| JP | 4-274346 | 9/1992 |
| JP | H6-326367 | 11/1994 |
| JP | H08-128889 | 5/1996 |
| JP | 10-185681 | 7/1998 |
| JP | 10-209418 | 8/1998 |
| JP | 10-227689 | 8/1998 |
| JP | 2001-041818 | 2/2001 |

(Continued)

*Primary Examiner* — Julio J Maldonado
*Assistant Examiner* — Joseph Galvin, III
(74) *Attorney, Agent, or Firm* — Drinker Biddle & Reath LLP (57) ABSTRACT

An infrared detector 1 having a bolometer element 11 and a reference element 21 is provided with a bolometer thin film 22 supported on a surface of a substrate 10 while spaced apart from the surface of the substrate 10, a metal film 23 for heat dissipation formed on a surface of the bolometer thin film 22 via an insulating film 31, wherein the surface of the bolometer thin film 22 faces the substrate 10, and a plurality of metal columns 25 connected thermally with the metal film 23 for heat dissipation and the substrate 10. Since heat generated from a photodetecting portion 22a by infrared rays is efficiently dissipated to the substrate 10 via the insulating film 31, the metal film 23 for heat dissipation, the metal columns 25, and a metal film 24 for heat dissipation on the side of the substrate, only temperature variation caused by variation in use environment can be measured accurately, and downsizing can be achieved while reducing the influence of temperature variation in use environment.

7 Claims, 9 Drawing Sheets

(56) References Cited

FOREIGN PATENT DOCUMENTS

| JP | 2001-099705 | 4/2001 |
|---|---|---|
| JP | 2002-533668 | 10/2002 |
| JP | 2005-043381 | 2/2005 |
| JP | 2008-022315 | 1/2008 |
| JP | 2008-219613 | 9/2008 |
| KR | 10-2009-0055766 | 6/2009 |
| WO | WO-01/81879 A2 | 11/2001 |
| WO | WO-2006/108210 A1 | 10/2006 |
| WO | WO-2006/120362 A1 | 11/2006 |

\* cited by examiner

PHOTODETECTOR

TECHNICAL FIELD

The present invention relates to a photodetector.

BACKGROUND ART

Conventionally, as a photodetector, there is known a so-called bolometer-type infrared detector for detecting infrared rays by using a material, the resistance value of which varies depending on temperature. As the bolometer-type infrared detector, for example, Patent Document 1 has disclosed that which is provided with a bolometer element for detecting infrared rays made incident and a reference element for detecting temperature variation caused by variation in use environment, in which signals output by these elements are used to calculate signals excluding the influence of temperature variation caused by variation in use environment, thereby detecting infrared rays. The infrared detector described in Patent Document 1 is provided with a bolometer element having a bolometer thin film supported via a cavity on a silicon substrate which is a diurnal capacity body and a reference element having a bolometer thin film formed via a sacrifice layer on the silicon substrate.
Patent Document 1: Japanese Unexamined Patent Application Publication No. 10-227689*2(JP10227689A)

SUMMARY OF INVENTION

Technical Problem

However, in the infrared detector described in Patent Document 1, since used is a material small in thermal conductivity and great in thermal capacity as a material for the sacrifice layer of the reference element, there is a fear that the influence of temperature variation in use environment may be insufficiently reduced, On the other hand, if the sacrifice layer of the reference element is made thin in an attempt to enhance response to temperature variation in use environment, such a constitution is obtained that is greatly different in height between the bolometer element and the reference element. Thus, for example, on patterning by exposure to light, depth of focus is difficult to control and formation of minute patterns is made difficult, which may hinder downsizing of the infrared detector.

Therefore, the present invention has been made in order to solve the above-described technical problems, an object of which is to provide a photodetector capable of achieving downsizing while sufficiently reducing the influence of temperature variation in use environment.

Solution to Problem

More specifically, a photodetector of the present invention is constituted with a first bolometer film which is supported on a surface of a substrate while spaced apart from the surface of the substrate, a second bolometer film which is supported on the surface of the substrate while spaced apart from the surface of the substrate and, a metal film for heat dissipation fanned on a surface of the bolometer thin film via an insulating film, wherein the surface of the bolometer thin film faces the substrate, and a plurality of metal columns connected thermally with the first metal film and the substrate.

In the photodetector of the present invention, via the insulating film, the first metal film and the metal columns, the second bolometer film is connected with the substrate. Therefore, where the second bolometer film is adopted as a bolometer film of the reference element, heat of the second bolometer film generated by infrared rays is efficiently dissipated to the substrate via the insulating film, the first metal film and the metal columns, thus making it possible to measure accurately only the temperature variation caused by variation in use environment. As a result, it is possible to efficiently reduce the influence of temperature variation in use environment. Further, there is no need to make the sacrifice layer thickness thin for efficiently dissipating heat of the reference element to the substrate. Thereby, for example, upon patterning by exposure to light, depth of focus is controlled easily and minute patterning is formed easily, consequently making it possible to achieve downsizing.

Here, it is preferable that the second metal film is formed at a region facing the second bolometer film on the surface of the substrate and the met-al columns are connected with the first metal film and the second metal film.

Thus, the second metal film is placed between the metal columns and the substrate, thereby where the second bolometer film is adopted as a bolometer film of the reference element, it is possible to increase a thermal contact area of the metal columns with the substrate. Thus, infrared rays made incident can be used to dissipate more efficiently heat generated at the second bolometer film to the substrate.

Further, it is preferable that at a region facing the first bolometer film on the surface of the substrate, a third metal film is formed. This constitution is obtained, thereby where the first bolometer film is adopted as a bolometer film of the bolometer element, infrared rays transmitted through the first bolometer film are reflected on the first bolometer film by the third metal film and made incident again to the first bolometer film. Therefore, it is possible to efficiently measure heat generated by infrared rays.

Still further, it is preferable that the first bolometer film and the second bolometer film are located so as to be approximately in parallel with the surface of the substrate and approximately flush with each other. The above constitution is obtained, by which, for example, upon patterning by exposure to light, depth of focus can be controlled more easily.

ADVANTAGEOUS EFFECTS OF INVENTION

According to the present invention, there is provided a photodetector capable of achieving downsizing while efficiently reducing the influence of temperature variation in use environment.

REFERENCE SIGNS LIST

1 . . . infrared detector (photodetector), 10 . . . substrate, 15 . . . bolometer thin film (first bolometer thin film), 22 . . . bolometer thin film (second bolometer film), 20 . . . reflection film (third metal film), 23 . . . metal film for heat dissipation (first metal film), 24 . . . metal film for heat dissipation on the side of a substrate (second metal film), 25 . . . metal column.

DESCRIPTION OF EMBODIMENTS

Hereinafter, a description will be made for an embodiment of the present invention by referring to the attached drawings. It is noted that in the descriptions of the drawings, the same reference will be given to the same elements and overlapping description will be omitted.

Figure 1:
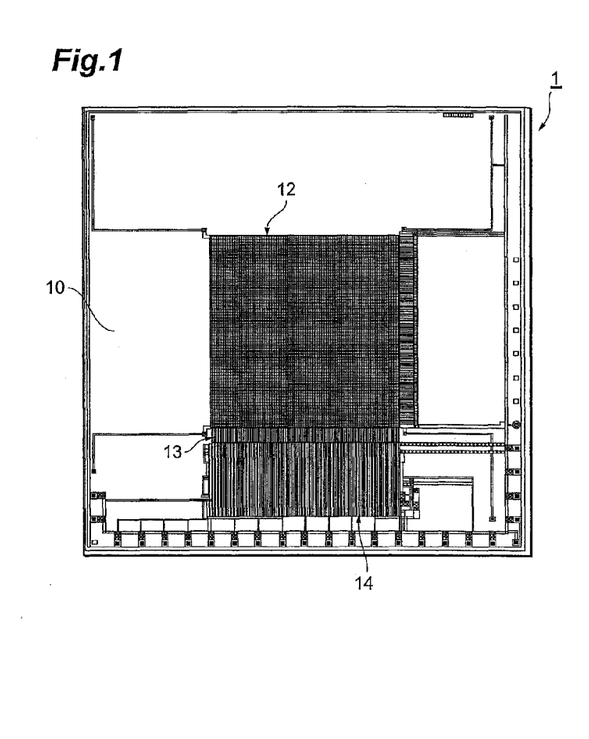
FIG. 1 is a plan view showing a constitution of an infrared detector which is one embodiment of a photodetector according to the present invention.
Figure 2:
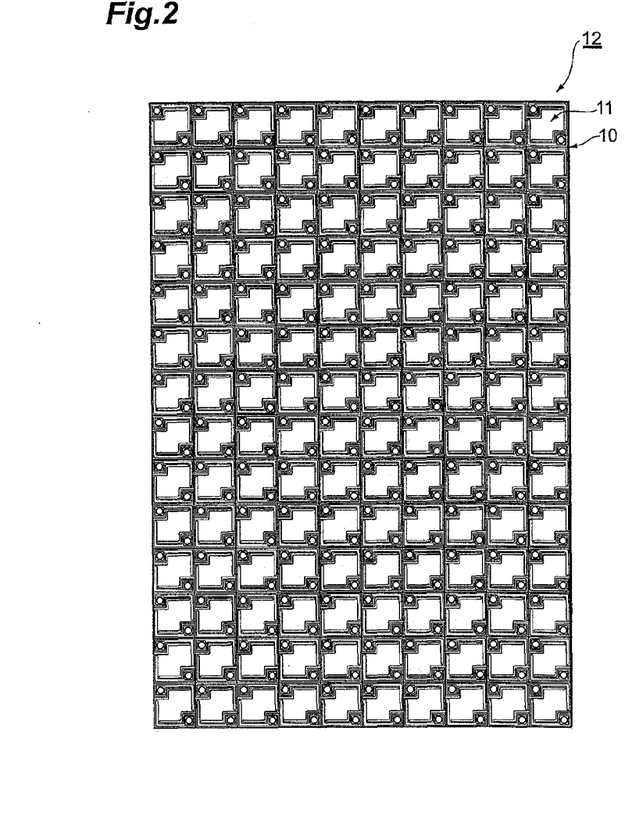
FIG. 2 is a partially enlarged plan view of a pixel portion of the infrared detector of FIG. 1.
Figure 3:
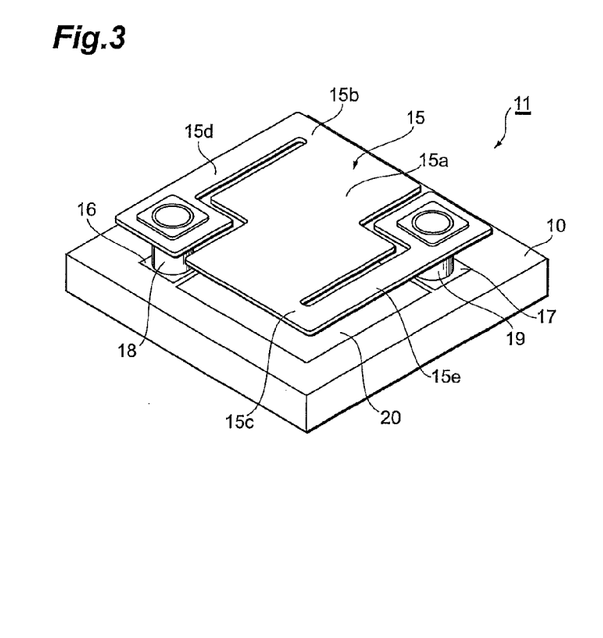
FIG. 3 is a perspective view of a bolometer element of the pixel portion of the infrared detector of FIG. 1.
Figure 4:
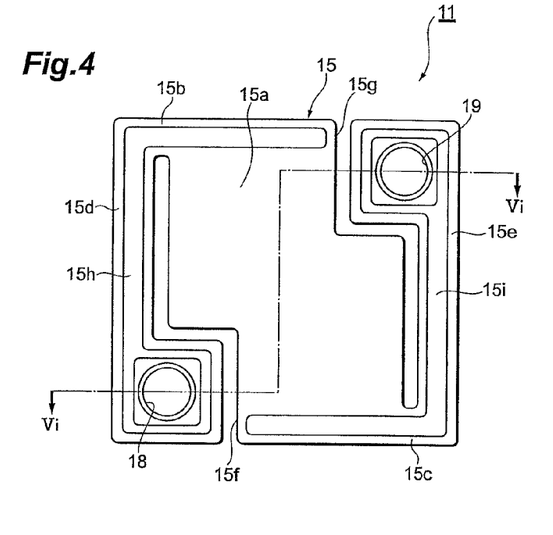
FIG. 4 is a plan view of the bolometer element of the pixel portion of the infrared detector of FIG. 1.
Figure 5:
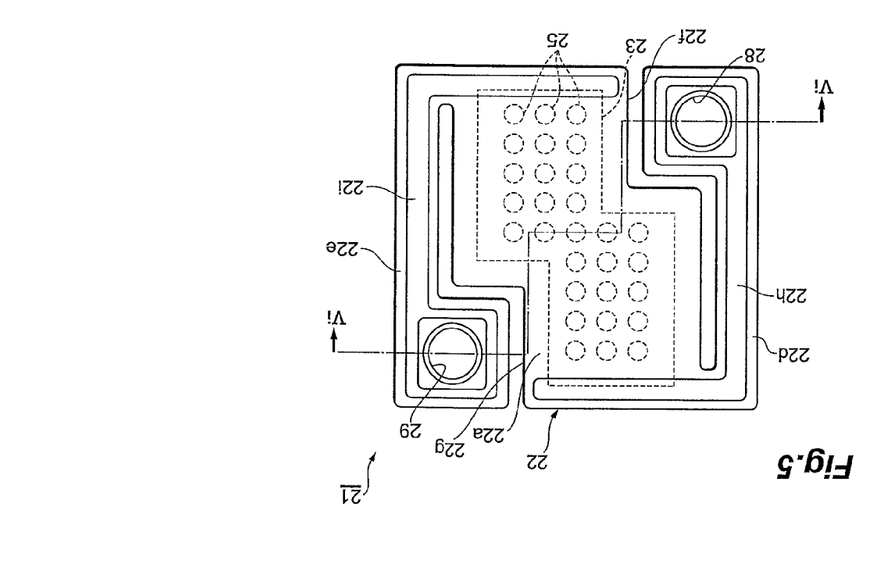
FIG. 5 is a plan view of a reference element at a reference pixel portion of the infrared detector of FIG. 1.
Figure 6:
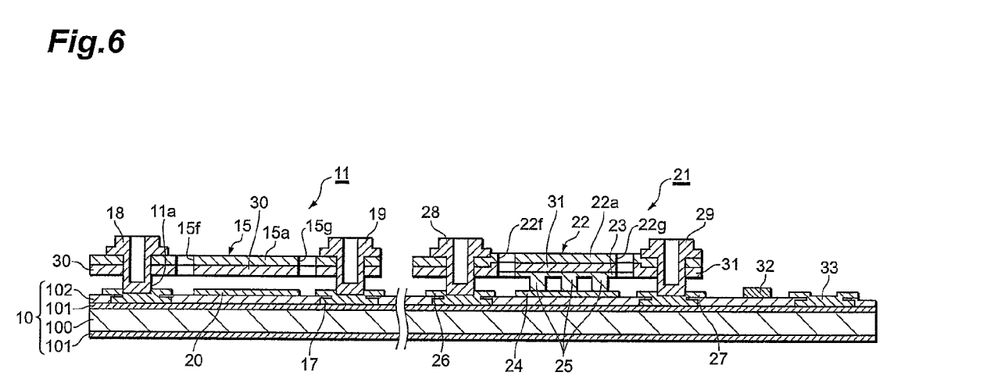
FIG. 6 is a combined cross-sectional view taken along line VI-VI of FIG. 4 and FIG. 5.

A photodetector of the embodiment of the present invention is a so-called bolometer-type infrared detector for detecting infrared rays by the use of a material, the resistance value of which will vary depending on a temperature and favorably used in an infrared imager, thermography etc. First, a description will be made for a constitution of the infrared detector according to the present embodiment. FIG. 1 is a plan view of an infrared detector which is one embodiment of a photodetector according to the present invention. FIG. 2 is a partially enlarged plan view of a pixel portion of the infrared detector of FIG. 1. FIG. 3 is a perspective view showing a constitution of one pixel of the infrared detector of FIG. 1. FIG. 4 is a plan view showing a constitution of one pixel at a pixel portion of the infrared detector of FIG. 1. FIG. 5 is a plan view showing a constitution of one pixel at a reference pixel portion of the infrared detector given in FIG. 1. FIG. 6 is a schematic cross sectional view of the infrared detector in combination of a cross section taken along line VI-VI of FIG. 4 with that taken along line VI-VI of FIG. 5.

As shown in FIG. 1, an infrared detector 1 is a detector for detecting infrared rays by thermal variation and constituted with a substrate 10, a pixel portion 12 which is formed on the substrate 10 to function as an infrared rays receiving unit, a reference pixel portion 13 which is formed on the substrate 10 to measure the influence by use environment, and a signal processing circuit portion 14. The pixel portion 12 and the reference pixel portion 13 are respectively connected electrically with the signal processing circuit portion 14. As the substrate 10, for example, a Si substrate is used. It is noted that hereinafter, where a thermally oxidized layer and a base layer are formed on the surface of the Si substrate, the substrate containing these layers is referred to as the substrate 10.

As shown in FIG. 2, the pixel portion 12 is formed by arraying two-dimensionally a plurality of pixels (bolometer element 11) on the substrate 10 and referred to as a so-called surface micro-machine. The bolometer element 11 constituting pixels is, as shown in FIG. 3 and FIG. 4, provided with ROIC (Read Only IC) pads 16, 17 formed on the surface of substrate 10, electrode plugs 18, 19 respectively formed on the ROIC pads 16, 17 and a bolometer thin film (first bolometer film) 15 arranged apart from the surface of the substrate 10.

The ROIC pads 16, 17 are rectangular pads having electrical conductivity and connected electrically with the signal processing circuit portion 14. The electrode plugs 18, 19 are formed on the ROM pads 16, 17 approximately in a column shape so as to extend in a laminated direction, and electrically connected with the ROIC pads 16, 17. The electrode plugs 18, 19 are made with a material with electrical conductivity, for example, Al is used.

The bolometer thin film 15 is a thin film arranged approximately in parallel with the substrate 10 and provided with a photodetecting portion 15a which receives infrared rays and is formed in a rectangular planar-surface shape, and beam portions 15d, 15e formed at corners 15b, 15c of the photodetecting portion 15a. The beam portions 15d, 15e extend from the corners 15b, 15c along an outer periphery of the photodetecting portion 15a and formed so as to face each other. Then, clearances between the photodetecting portion 15a and the beam portions 15d, 15e are spatially apart via slits 15f, 15g respectively and thermally separated. The bolometer thin film 15 is made with a material great in specific resistance variation caused by temperature variation, for example, amorphous silicon is used.

Further, at the beam portions 15d, 15e of the bolometer thin film 15, wires 15h, 15i electrically connected with the photodetecting portion 15a are provided along configurations of the beam portions 15d, 15e, Then, as shown in FIG. 3 and FIG. 6, the bolometer thin film 15 is supported on the surface of the substrate 10 by one-end portions of the beam portions 15d, 15e which are respectively connected with the electrode plugs 18, 19. Between the bolometer thin film 15 and the substrate 10, there is formed a void space 11a. Then, as shown in FIG. 4, the wires 15h, 15i of the beam portions 15d, 15e are electrically connected with electrode plugs 18, 19, respectively. Thereby, the wires 15h, 1 Si are electrically connected via the electrode plugs 18, 19 and the ROC pads 16, 17 with the signal processing circuit portion 14.

Further, as shown in FIG. 6, on a surface of the bolometer thin film 15 facing the substrate 10, an insulating film 30 is formed. As the insulating film 30, for example, a silicon-oxidized film is used which is based on TEOS (Tetraethyl orthosilicate) and formed by a plasma CVD (Chemical Vapor Deposition) method. Then, at a region facing the bolometer thin film 15 on the surface of the substrate 10 of the bolometer element 11, there is laminated a reflection film (third metal film) 20. As this reflection film 20, a metal greater in reflectance with respect to infrared rays is used.

Thus, the bolometer element 11 is constituted in such a manner that the bolometer thin film 15 is apart from the surface of the substrate 10 and arranged approximately in parallel with the substrate 10 (membrane constitution), and a clearance between the bolometer thin, film 15 and the substrate 10 is spatially apart by the void space 11a and thermally separated. Then, such a constitution is provided that specific resistance variation caused by temperature variation at the photodetecting portion 15a of the bolometer thin film 15 is read via the wires 15h, 15i, the electrode plugs 18, 19 and ROIC pads 16, 17 at the signal processing circuit portion 14.

On the other hand, the reference pixel portion 13 is formed by arraying two-dimensionally a plurality of pixels (reference element 21) on the substrate 10, and each of the pixels is given as a so-called optical black. The pixel-constituting reference element 21 is, as shown in FIG. 5 and FIG. 6, constituted so as to be substantially similar to the bolometer element 11, but different from the bolometer element 11 in that it is provided with a metal film for heat dissipation (first metal film) 23, a metal film for heat dissipation on the side of a substrate (second metal film) 24 and a plurality of metal columns 25. It is noted that a description will be omitted for the ROIC pads 26, 27 and the electrode plugs 28, 29 which are constituted in the same manner as the bolometer element 11.

The bolometer thin film (second bolometer film) 22 has a similar constitution to the bolometer thin film 15 and is provided with a photodetecting portion 22a, beam portions 22d, 22e, wires 22h, 22i and slits 22f, 22g. Then, as shown in FIG. 6, the bolometer thin film 22 and the bolometer thin film 15 are approximately in parallel with the surface of the substrate 10 and located so as to be approximately flush with each other. Here, being approximately flush means a planar surface in such a range that includes a difference in thickness of a metal film 23 for heat dissipation to be described later in a laminating direction, for example, a planar surface within a range of approximately ±1 μm.

Further, on a surface of the photodetecting portion 22a facing the substrate 10, there is formed a rectangular planar surface-shaped metal film 23 for heat dissipation via an insulating film 31. The insulating film 31 is constituted with a material similar to that of the insulating film 30 of the bolometer element 11. Still further, as the metal film 23 for heat dissipation, for example, Al, Cu or W is used.

Then, between the metal film 23 for heat dissipation and the substrate 10 there are formed a plurality of metal columns 25. The metal columns 25 which are columns made with a metal and extending in a laminating direction are formed apart at constant intervals in a direction orthogonal to the laminating direction. The metal columns 25 are thermally connected with the metal film 23 for heat dissipation and the substrate 10. As the metal columns 25, for example, Al, Cu or W is used, It is noted that the metal columns 25 may be formed integrally with the metal film 23 for heat dissipation. Further, at a region facing the photodetecting portion 22a of the bolometer thin film 22, on a surface of the reference element 21 facing the substrate 10, there is formed a rectangular planar surface-shaped metal film 24 for heat dissipation on the side of the substrate. The metal film 24 for heat dissipation on the side of the substrate has an area greater than a cross-sectional area of the plurality of metal columns 25 and thermally connected with the metal columns 25 and the substrate 10. The metal film 24 for heat dissipation on the side of the substrate is made with a metal and, for example, Al, Cu or W is used.

As described so far, the reference element 21 is constituted in such a manner that heat generated by temperature variation caused at the bolometer thin film 22 by infrared rays made incident is dissipated to the substrate 10 via the insulating film 31, the metal film 23 for heat dissipation, the metal columns 25, and the metal film 24 for heat dissipation on the side of the substrate. Then, such a constitution is provided that specific resistance variation caused by temperature variation such as environmental variation of the bolometer thin film 22 etc., can be read via the wires 22h, 22i, the electrode plugs 28, 29 and the ROIC pads 26, 27 by the signal processing circuit portion 14.

Figure 7:
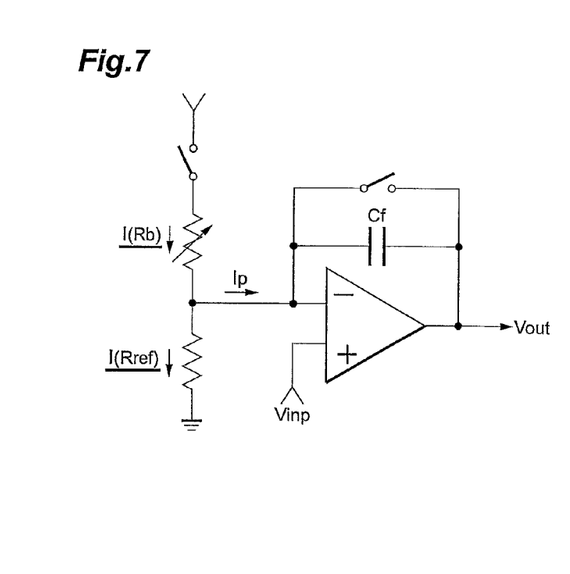
FIG. 7 is a circuit diagram of a signal processing circuit portion shown in FIG. 1.
Figure 8:
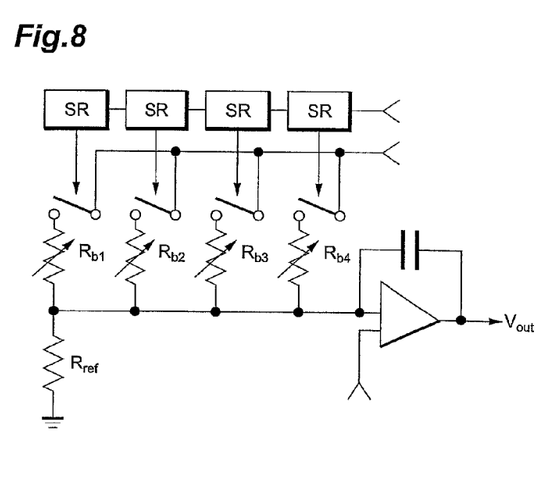
FIG. 8 is a circuit diagram of the signal processing circuit portion shown in FIG. 1.

Further, the signal processing circuit portion 14 shown in FIG. 1 is a reading-out circuit which is installed on. the substrate 10, and has functions to read out output signals of the pixel portion 12 and the reference pixel portion 13 to subtract the output signal of the reference pixel portion 13 from output signal of the pixel portion 12. Hereinafter, the reading-out circuit will be specifically described by referring to FIG. 7 and FIG. 8. FIG. 7 and FIG. 8 are circuit diagrams showing reading-out circuits at the signal processing circuit portion 14. First, with easy understanding of the description taken into account, a description will be made by exemplifying a minimally constituted infrared detector having respectively one bolometer element 11 and one reference element 21. In this minimum constitution, for example, an integrating circuit shown in FIG. 7 is used to measure an output voltage Vout. The output voltage Vout is expressed in the following formula (1) by giving a charge amplifier input current obtained by subtracting a reference resistance current I (Rref) flowing to the photodetecting portion 22a of the reference element 21 from a bolometer current I (Rb) flowing to the photodetecting portion 15a of the bolometer element 11 as Ip and giving an integral capacity of a condenser as Cf, $$Vout-Vinp=-Ip \cdot t/Cf \quad (1)$$

The signal processing circuit portion 14 uses the formula (1) to convert variation in resistance value to variation in output voltage Vout, thereby detecting infrared rays on the basis of this electric signal.

Next, a description will be made for an infrared detector made up of a plurality of bolometer elements 11 and one reference element 21. In this instance, for example, as shown in the circuit diagram of FIG. 8, a shift register SR is used to measure an output voltage Vout on the basis of a charge amplifier input current Ip corresponding to each bolometer current I (Rbn) (n: an integral). Then, on the basis of this electrical signal, infrared rays are detected.

Next, a description will be made for operations of the above-constituted infrared detector 1. First, when infrared rays are made incident into the infrared detector 1, infrared rays are absorbed at the photodetecting portion 15a of the bolometer element 11 and converted to heat. Here, the photodetecting portion 15a is thermally separated by a void space 11a formed between the slits 15f, 15g, the bolometer thin film 15 and the substrate 10. Therefore, heat generated at the photodetecting portion 15a is not dissipated around but elevating a temperature at the photodetecting portion 15a to vary a resistance value of the photodetecting portion 15a according to the temperature elevation. Thus, variation in resistance value is sent as a signal via the wires 15h, 15i electrically connected with the photodetecting portion 15a, electrode plugs 18, 19 and the ROIC pads 16, 17 to the signal processing circuit portion 14.

Further, where some of the infrared rays which have been made incident into the bolometer thin film 15 are not absorbed at the photodetecting portion 15a but transmitted, the thus transmitted infrared rays are reflected by the reflection film 20 and made incident again into the photodetecting portion 15a. The infrared rays made incident again are absorbed at the photodetecting portion 15a and converted to heat. Thereby, it is possible to efficiently absorb infrared rays.

On the other hand, when infrared rays are made incident into the infrared detector 1, as with the bolometer element 11, infrared rays are made incident into the reference element 21 as well, and the infrared rays are absorbed at the photodetecting portion 22a of the reference element 21 and converted to heat. Here, the photodetecting portion 22a is thermally connected via the insulating film 31 with the metal film 23 for heat dissipation, the metal columns 25, the metal film 24 for heat dissipation on the side of the substrate, and the substrate 10. Therefore, heat generated at the photodetecting portion 22a by infrared rays which have been made incident is transmitted sequentially from the insulating film 31, the metal film 23 for heat dissipation, the metal columns 25 to the metal film 24 for heat dissipation on the side of the substrate and dissipated to the substrate 10. Therefore, only heat generated by temperature variation caused by environmental variation of the infrared detector 1 will vary a resistance value of the photodetecting portion 22a. Thus, variation in resistance value caused by the environmental variation will be sent to the signal processing circuit portion 14 as a signal via the wires 22h, 22i electrically connected with the photodetecting portion 22a, the electrode plugs 28, 29 and the ROIC pads 26, 27.

Then, at the signal processing circuit portion 14, variation in resistance value of the photodetecting portions 15a, 22a is converted to voltage variation and infrared rays are detected on the basis of the electrical signal.

Thus, in the infrared detector 1, the bolometer thin film 22 is connected with the substrate 10 via the insulating film 31, the metal film 23 for heat dissipation and the metal columns 25 at the reference element 21. Therefore, heat generated by infrared rays at the photodetecting portion 22a of the bolometer thin film 22 is efficiently dissipated to the substrate 10 via the insulating film 31, the metal film 23 for heat dissipation, a plurality of metal columns 25, the metal film 24 for heat dissipation on the side of the substrate, thus making it possible to accurately measure only temperature variation caused by variation in use environment. As a result, it is possible to efficiently reduce the influence of temperature variation in use environment.

Further, in the reference element 21, the metal film 24 for heat dissipation on the side of the substrate is placed between the metal columns 25 and the substrate 10, thus making it possible to increase a thermal contact area of the metal columns 25 and the substrate 10. Thereby, it is possible to dissipate more efficiently heat generated at the bolometer thin film 22 by the infrared rays made incident to the substrate 10.

Further, in the reference element 21, a member thermally connecting the photodetecting portion 22a and the substrate 10 is constituted with a plurality of columnar metal columns 25. Therefore, as compared with a case where a member thermally connecting the photodetecting portion 22a and the substrate 10 being constituted with a mass of metal, a difference in thermal expansion between the photo detecting portion 22a and the metal columns 25 or between the substrate 10 and the metal columns 25 can be used to prevent stress from being applied to the bolometer thin film 15. As a result, it is possible to prevent cracks on the bolometer thin film 15.

Still further, in the reference element 21, where the metal columns 25 are formed integrally with the metal film 23 for heat dissipation, it is possible to disperse stress caused by a difference in thermal expansion between the substrate 10 and a heat transmitting body. As a result, it is possible to prevent cracks on the bolometer thin film 15.

In addition, since the reference element 21 is similar in configuration to the bolometer element 11, it is possible to reduce a resistance difference resulting from a difference in configuration between the elements. This is favorably adoptable as a reference element.

Next, a description will be made for a method for producing the infrared detector 1 according to the present embodiment. It is noted that steps of producing the reference element 21 include a step of producing the bolometer element 11. Therefore, hereinafter, a description will be made mainly for steps of producing the reference element 21. FIG. 9 to FIG. 14 are sectional side views showing steps of producing the reference element 21 of the infrared detector 1 shown in FIG. 1.

Figure 9:
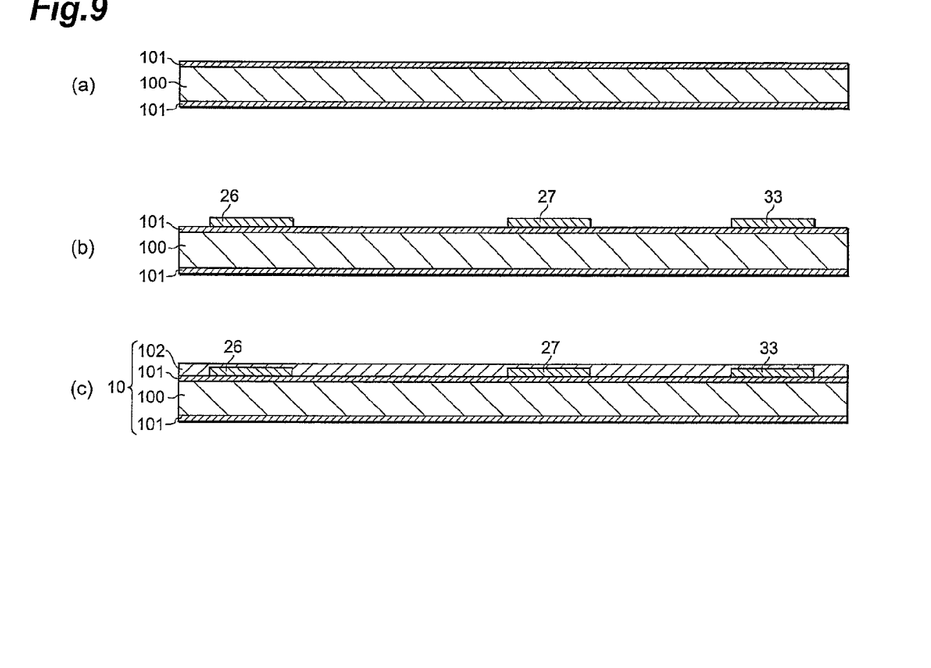
FIG. 9 is a cross sectional view showing a substrate thermally-oxidizing step, a first-electrode forming step and a $SiO_2$ laminating step of the reference element shown in FIG. 6.

First, as shown in FIG. 9(a), a substrate thermally-oxidizing step is performed. In this step, oxidation is performed on the surface of a Si substrate 100 to form a thermally oxidized film 101 on the Si substrate 100. The thermally oxidized film 101 is, for example, 0.7 μm in film thickness.

Next, as shown in FIG. 9(b), a first-electrode forming step is performed. In this step, the ROIC pads 26, 27 and the electrode pad 33 of the reference element 21 are formed on the thermally oxidized film 101. For example, Al—Si—Ti is laminated at a thickness of 1 μm, mask processing by photoresist is performed, and thereafter, etching is performed to form the ROIC pads 26, 27 and the electrode pad 33. As etching, dry etching is preferably used for highly uniform formation. Wet etching may also be performed.

Then, as shown in FIG. 9 (c), a $SiO_2$ laminating step is performed. In this step, a $SiO_2$ film 102 is laminated on the thermally oxidized film 101, the ROIC pads 26, 27 and the electrode pad 33. For example, plasma CVD is performed to laminate the $SiO_2$ film 102 at a thickness of 1 μm. It is noted that, here, the Si substrate 100, the thermally oxidized film 101 and the $SiO_2$ film 102 are given as the substrate 100.

Figure 10:
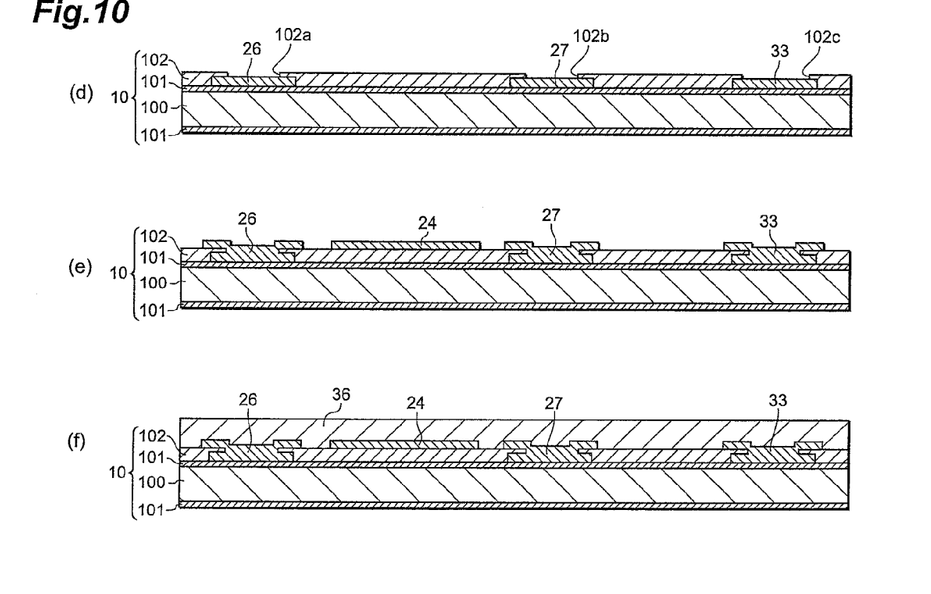
FIG. 10 is a cross sectional view showing an opening-forming step, a second-electrode forming step and a sacrifice-layer coating step of the reference element shown in FIG. 6.

Then, as shown in FIG. 10 (d), an opening-forming step is performed. In this step, openings 102a, 102b, 102c are formed on the $SiO_2$ film 102 respectively at the ROIC pads 26, 27 and the upper part of the electrode pad 33. For example, the $SiO_2$ film 102 is subjected to mask processing with a photoresist and etching is performed to remove the $SiO_2$ film 102, thereby forming the openings 102a, 102b, 102c.

Next, as shown in FIG. 10(e), a second-electrode forming step is performed. In this step, there is formed a metal layer, the material of which is the same as that of the ROIC pads 26, 27 and the electrode pad 33, mask processing with a photoresist is performed, thereafter, etching is performed to effect patterning, thereby forming the ROIC pads 26, 27, the electrode pad 33 and the metal film 24 for heat dissipation on the side of the substrate. More specifically, the ROIC pads 26, 27 and the electrode pad 33 formed in the first-electrode forming step are respectively integrated with the ROIC pads 26, 27 and the electrode pad 33 formed in the second-electrode forming step. Upper faces of the ROIC pads 26, 27 and the electrode pad 33 are formed so as to be located on the $SiO_2$ film 102 via the opening 102a, 102b, 102c. Then, the upper faces of the ROIC pads 26, 27, the electrode pad 33 and the metal film 24 for heat dissipation on the side of the substrate are formed so that they are located to be flush with each other. Thus, the upper faces of the ROIC pads 26, 27, the electrode pad 33 and the metal film 24 for heat dissipation on the side of the substrate are formed so that they are located to be flush with each other, by which a membrane structure of the reference element 21 is planarized.

Then, as shown in FIG. 10(f), a sacrifice-layer coating step is performed. In this step, the sacrifice layer 36 is formed by coating. As the sacrifice layer 36, for example, polyimide is used, and the film thickness is, for example, 2.5 μm.

Figure 11:
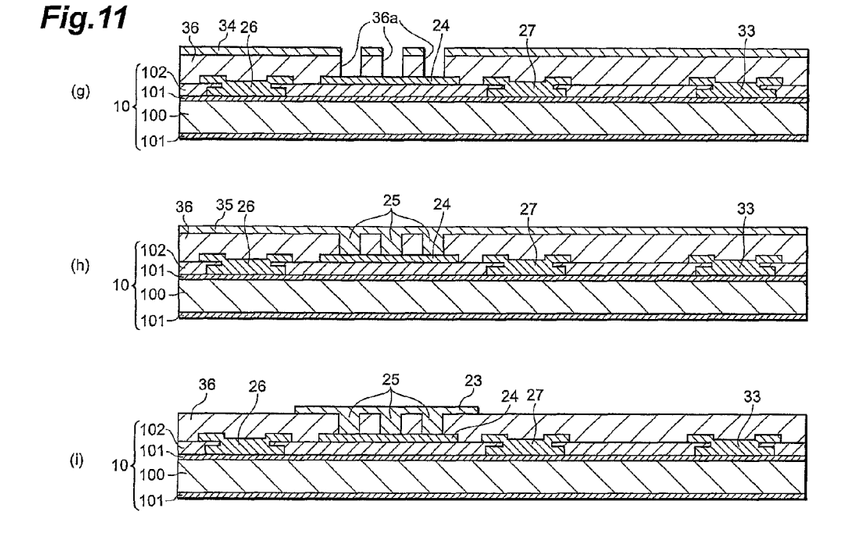
FIG. 11 is a cross sectional view showing a dummy pixel preparing step, a metal column forming step and a step of forming metal film for heat dissipation of the reference element shown in FIG. 6.

Next, as shown in FIG. 11(g), a dummy pixel preparing step is performed. In this step, first, as prior processing for forming an opening, a protective layer 34 is laminated. For example, amorphous silicon is laminated to form the protective layer 34. Further, TEOS-SiO$_2$ (SiO$_2$ film formed by a plasma CVD device using TEOS) may be laminated to form the protective layer 34. As the protective layer 34, for example, lamination at a thickness of 50nm is performed. Then, mask processing with a photoresist is formed, and, thereafter, etching is performed to form a plurality of openings 36a which penetrate through the protective layer 34 and the sacrifice layer 36. The openings 36a are formed so as to give an inner diameter as small as possible, for example, the inner diameter is 2μm. An interval pitch of the openings 36a is from 2μm to 5μm. Then, after formation of the openings 36a, the protective layer 34 is removed. Where, as the protective layer 34, for example, amorphous silicon is used, XeF$_2$ is used for removing the layer. Where, as the protective layer 34, for example, TEOS-SiO$_2$ is used, HF is used for removing the layer.

Figure 15:
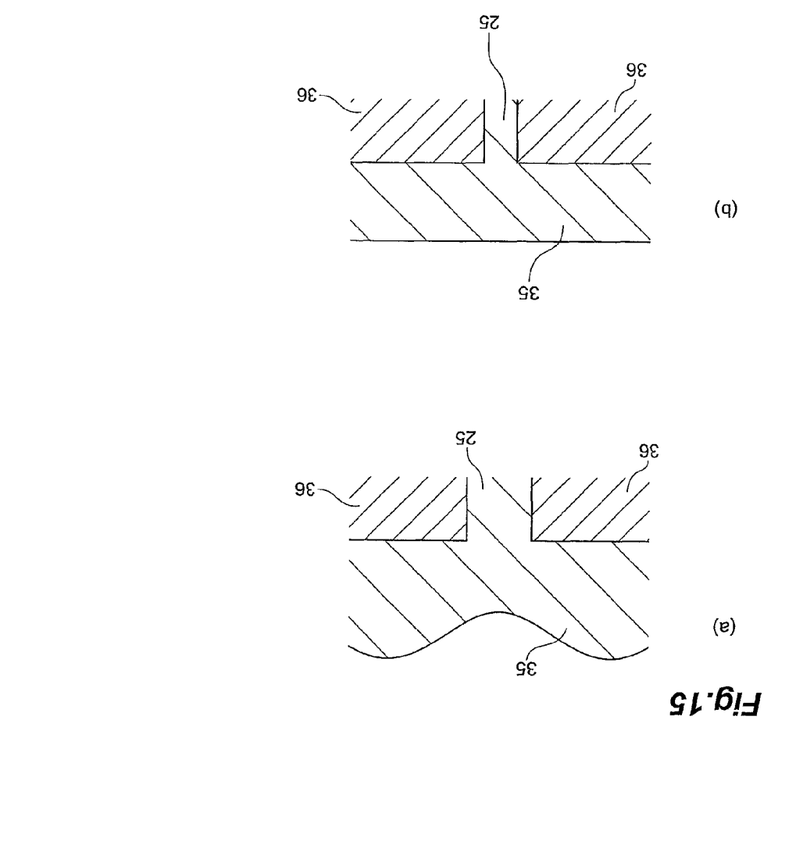
FIG. 15 is a schematic diagram for describing effects of metal columns shown in FIG. 11.

Then, as shown in FIG. 11(h), a metal-column forming step is performed. In this step, a metal film 35 is formed inside the opening 36a and on the upper face of the sacrifice layer 36 formed by the dummy pixel preparing step, For example, sputtering is performed to laminate Al, Cu or W at a thickness of 1 μm, thereby forming the metal film 35. Thereby, metal columns 25 are formed inside the opening 36a. The metal columns 25 are, for example, 2 μm in outer diameter and have a pitch of 2 μm to 5 μm. Here, in the dummy pixel preparing step, the opening 36a is formed so as to be small in inner diameter as much as possible. Therefore, for example, as shown in FIG. 15(a), as compared with a case where the outer diameter of the metal column 25 (more specifically, the inner diameter of the opening 36a) is great, as shown in FIG. 15(b), it is possible to planarize the metal film 35 continuing to the upper part of the metal column 25. Thereby, such a necessity is eliminated that in order to planarize a membrane structure, a planarization step (etch-back step) is performed after the metal column forming step, thus making it possible to reduce production costs. Further, the metal columns 25 are formed so as to be small in outer diameter, by which a small quantity of metal can be used to reduce material costs.

Then, as shown in FIG. 11(i), a step of forming metal film for heat dissipation is performed. In this step, mask processing with a photoresist and etching of the metal film 35 are performed, thereby forming a metal film 23 for heat dissipation on the upper part of metal columns 25. Thus, the metal columns 25 and the metal film 23 for heat dissipation are formed integrally, thus making it possible to disperse stress generated by a difference in thermal expansion between the substrate 10 and the metal columns 25. As a result, it is possible to prevent cracks on the bolometer thin film 15.

Figure 12:
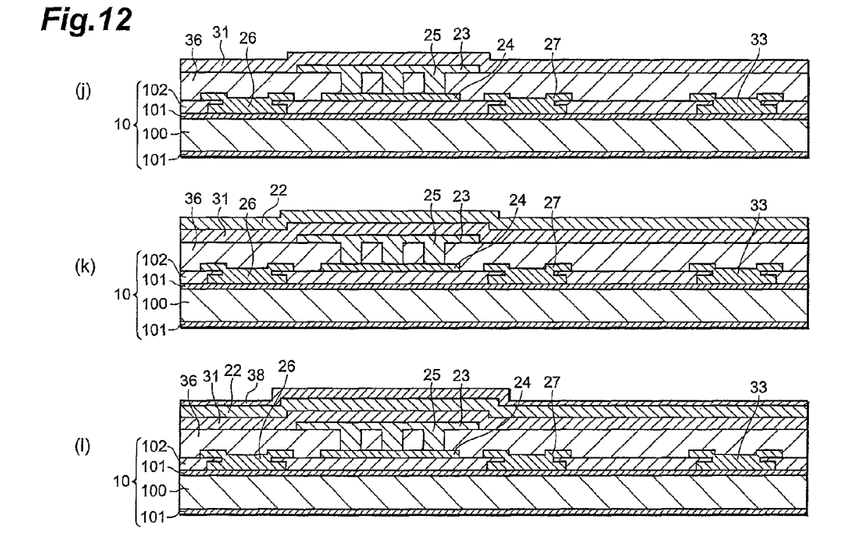
FIG. 12 is a cross sectional view showing an insulating-film laminating step, a bolometer thin film laminating step and a step of laminating metal film for electrode of the reference element shown in FIG. 6.

Then, as shown in FIG. 12(j), an insulating-film laminating step is performed. In this step, as an insulating film 31, for example, TEOS-SiO$_2$ is laminated at a thickness of 100 nm. Thereafter, as shown in FIG. 12(k), a bolometer thin film laminating step is performed. In this step, as a bolometer thin film 22, for example, amorphous silicon is laminated at a thickness of 100 nm. Thereafter, as shown in FIG. 12(l), a step of laminating metal film for electrode is performed. In this step, a metal film for electrode 38 is laminated. As the metal film for electrode 38, for example, WSi or Ti is laminated at a thickness of 50 nm. It is noted that the metal film for electrode 38 may be laminated at a thickness of 100 nm.

Figure 13:
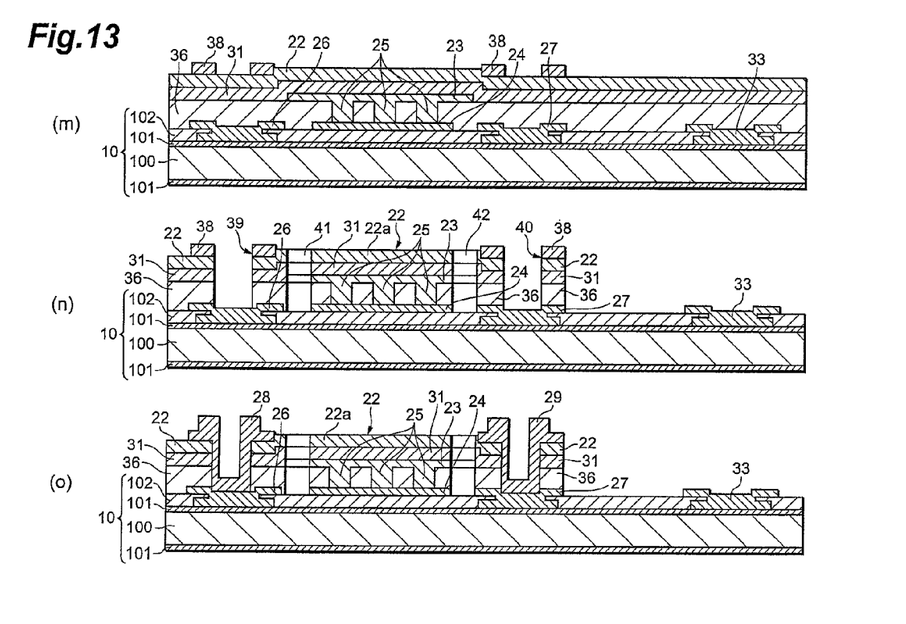
FIG. 13 is a cross sectional view showing an upper-electrode forming step, an opening-forming step and an electrode plug forming step of the reference element shown in FIG. 6.

Next, as shown in FIG. 13(m), an upper-electrode forming step is performed. In this step, the metal film for electrode 38 is subjected to mask processing with a photoresist and thereafter to patterning, thereby forming an upper electrode 38a. Thereafter, as shown in FIG. 13(n), an opening-forming step is performed. In this step, openings 39, 40 are formed respectively on the upper layers of the ROIC pads 26, 27. Then, openings 41, 42 are formed respectively on a layer of the substrate 10 located between the metal film 24 for heat dissipation on the side of the substrate and the ROIC pads 26, 27, and a layer on the electrode pad 33 is removed.

Then, as shown in FIG. 13(o), an electrode plug forming step is performed. In this step, sputtering or vacuum deposition is performed to laminate a metal, thereafter, lift-off processing is performed to form electrode plugs 28, 29 respectively at the openings 39, 40. For example, Al is used to form the electrode plugs 28, 29. Thereby, the upper electrode 38a is integrally formed with the electrode plugs 28, 29 respectively.

Figure 14:
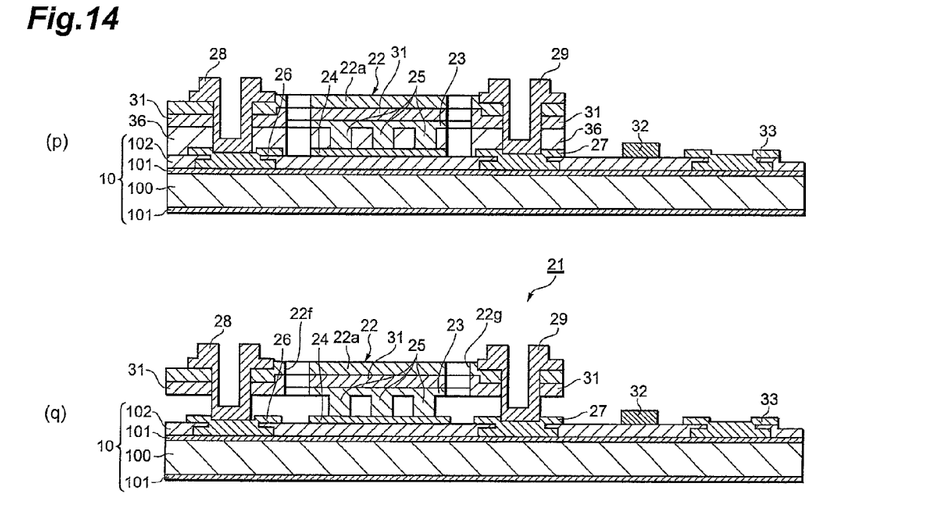
FIG. 14 is a cross sectional view showing a lower-electrode forming step and a sacrifice-layer removing step of the reference element shown in FIG. 6.

Next, as shown in FIG. 14(p), a lower electrode forming step is performed. In this step, a metal film for electrode is subjected to mask processing with a photoresist, thereafter patterned by lift-off processing, thereby forming a lower electrode 32. The lower electrode 32 includes, for example, the ROIC pads 26, 27, the signal processing circuit 14 and a wire connecting therewith. Thereafter, as shown in FIG. 14(q), a sacrifice-layer removing step is performed. In this step, for example, a polyimide-made sacrifice layer 36 is subjected to aching by O$_2$. Thus, the sacrifice layer 36 is completely removed and thermal processing etc., are performed in the process, thus making it possible to prevent unwanted gas generated from the sacrifice layer 36.

The steps shown in FIG. 9 to FIG. 14 are performed, by which it is possible to produce the reference element 21 capable of dissipating favorably heat resulting from absorption of infrared rays to the substrate 10. It is noted that where the bolometer element 11 is produced, none of the dummy pixel preparing step, the metal column forming step and the step of forming metal film for heat dissipation are needed. Here, the bolometer element 11 and the reference element 21 are able to be produced at the same time on the same substrate 10. In this instance, the bolometer thin film 15 and the bolometer thin film 22 are approximately in parallel with the surface of the substrate 10 and located so as to be approximately flush with each other. Therefore, upon patterning by exposure to light, depth of focus can be controlled easily. As a result, the infrared detector 1 can be downsized. Further, in the above-described production, the pixel portion 12 and the reference pixel portion 13 are enhanced in uniformity of specific resistance, thus making it possible to enhance functions as a reference element. Then, the signal processing circuit portion 14 produced independently is connected with the pixel portion 12 composed of the bolometer element 11 and the reference pixel portion 13 composed of the reference element 21, thereby completing the infrared detector 1.

Figure 16:
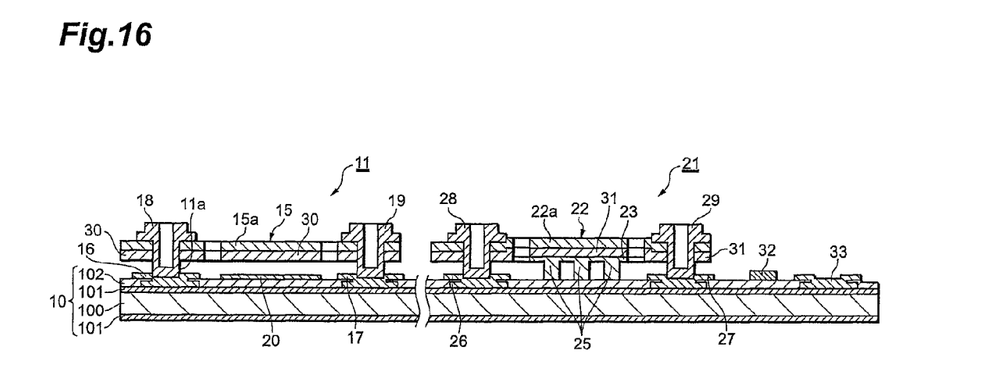
FIG. 16 shows a modified example of the infrared detector shown, in FIG. 1.

It is noted that the above-described embodiment shows one example of an infrared detector according to the present invention. The infrared detector according to the present invention shall not be limited to the infrared detector according to the embodiment but may include that in which the infrared detector according to the embodiment is modified or applied to others, For example, in the above-described embodiment, a description has been made for the infrared detector 1 equipped with the reference element 21 having the metal film 24 for heat dissipation on the side of the substrate. However, as shown in FIG. 16, also acceptable is that in which the reference element 21 is not provided with the metal film 24 for heat dissipation on the side of the substrate. In the above constitution, heat generated at the photodetecting portion 22a by infrared rays is transmitted sequentially from the insulating film 31, the metal film 23 for heat dissipation, to the metal columns 25 and dissipated to the substrate 10. Therefore, as with the above-described embodiment, the reference element 21 detects accurately temperature variation caused by environmental variation etc. It is possible to efficiently reduce the influence of temperature variation in use environment and also achieve downsizing.

Figure 17:
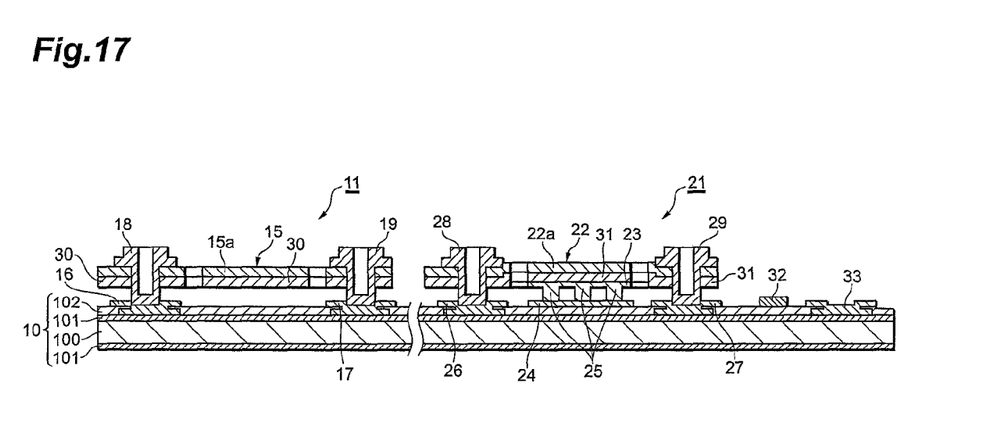
FIG. 17 shows a modified example of the infrared detector shown in FIG. 1.

Further, in the above-described embodiment, a description has been made for the infrared detector 1 equipped with the bolometer element 11 having the reflection film 20. However, as shown in FIG. 17, also acceptable is that in which the bolometer element 11 is not provided with the reflection film 20. In the above constitution as well, heat generated at the photodetecting portion 22a of the reference element 21 by infrared rays is transmitted sequentially from the insulating film 31, the metal film 23 for heat dissipation, the metal columns 25, to the metal film 24 for heat dissipation on the side of the substrate and dissipated to the substrate 10. Therefore, as with the above-described embodiment, the reference element 21 detects accurately temperature variation caused by environmental variation etc. It is possible to efficiently reduce the influence of temperature variation in use environment and also achieve downsizing.

Figure 18:
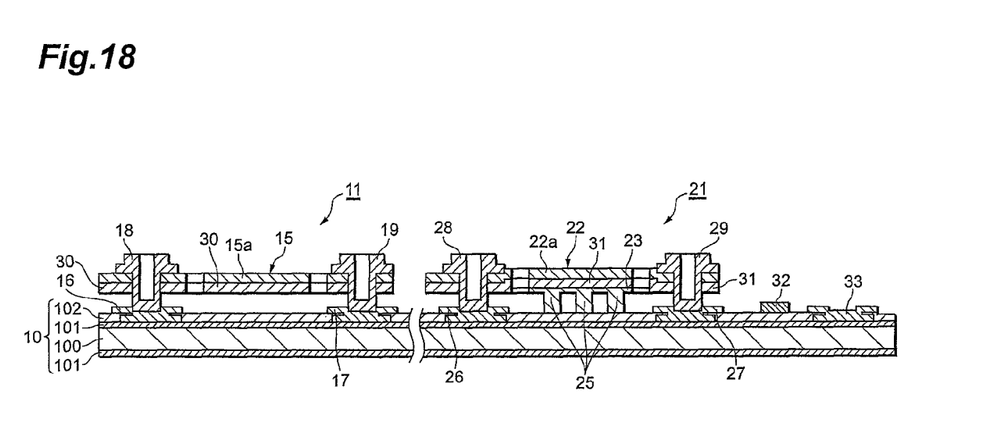
FIG. 18 shows a modified example of the infrared detector shown in FIG. 1.

Still further, in the above-described embodiment, a description has been made for the reference element 21 having the metal film 24 for heat dissipation on the side of the substrate, and the infrared detector 1 equipped with the bolometer element 11 having the reflection film 20. However, as shown in FIG. 18, also acceptable is that in which the reference element 21 is not provided with the metal film 24 for heat dissipation on the side of the substrate and the bolometer element 11 is not provided with the reflection film 20. In the above constitution, heat generated at the photodetecting portion 22a of the reference element 21 by infrared rays is transmitted sequentially from the insulating film 31, the metal film 23 for heat dissipation to the metal column 25 and dissipated to the substrate 10. Therefore, as with the above-described embodiment, the reference element 21 detects accurately temperature variation caused by environmental variation etc. It is possible to efficiently reduce the influence of temperature variation in use environment and also achieve downsizing.

In addition, in the above-described embodiment, a description has been made for a case where the metal columns 25 are formed in a columnar shape. It is also acceptable that the cross section of the metal column 25 is formed in a rectangular or triangular column shape. In this case as well, it is possible to efficiently reduce the influence of temperature variation in use environment and also achieve downsizing.

The invention claimed is:

1. A photodetector comprising:
   a first bolometer film supported on a surface of a substrate while spaced apart from the surface of the substrate;
   a second bolometer film supported on the surface of the substrate while spaced apart from the surface of the substrate;
   a first metal film formed on a surface of the second bolometer film via an insulating film, wherein the surface of the second bolometer film faces the substrate;
   a plurality of metal columns thermally connected with the first metal film and the substrate;
   a first insulating film formed on a surface of the first bolometer film facing a substrate;
   a second insulating film formed on a surface of the second bolometer film facing a substrate,
   a bolometer element having the first bolometer film; and
   a reference element having the second bolometer film,
   one side of the insulating film and the first metal film are physically in contact, and another side of the insulating film and a bolometer film are physically in contact, and the insulating film is present between a plurality of metal columns and a bolometer film,
   the first bolometer film and the second bolometer film are separate from each other,
   the first insulating film and the second insulating film are separate from each other, and
   the first bolometer film does not include a plurality of metal columns.

2. The photodetector according to claim 1, wherein at a region facing the second bolometer film on the surface of the substrate, a second metal film is formed and the metal columns are connected with the first metal film and the second metal film.

3. The photodetector according to claim 1, wherein at a region facing the first bolometer film on the surface of the substrate, a third metal film is formed.

4. The photodetector according to claim 1, wherein the first bolometer film and the second bolometer film are approximately in parallel with the surface of the substrate and located so as to be approximately flush with each other.

5. The photodetector according to claim 1, further comprising:
   electrode plugs that are electrically connected to the bolometer films,
   wherein the plurality of metal columns not electrically connected to the bolometer films.

6. The photodetector according to claim 1, wherein the plurality of metal columns are formed directly below a region where the bolometer is present when viewed from the direction at which infrared rays are incident.

7. The photodetector according to claim 1, wherein a region is formed by electrode plugs between the second bolometer film, the second insulating film and the substrate, and the plurality of metal columns are formed in a region between the electrode plugs.

* * * * *

UNITED STATES PATENT AND TRADEMARK OFFICE
CERTIFICATE OF CORRECTION

PATENT NO.         : 8,692,348 B2
APPLICATION NO.    : 12/922805
DATED              : April 8, 2014
INVENTOR(S)        : Suzuki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 157 days.

Signed and Sealed this

Twenty-ninth Day of September, 2015

Michelle K. Lee
*Director of the United States Patent and Trademark Office*